United States Patent
Kim

(10) Patent No.: US 12,003,053 B2
(45) Date of Patent: Jun. 4, 2024

(54) ELASTIC ELECTRICAL CONTACT TERMINAL

(71) Applicant: JOINSET CO., LTD., Ansan-si (KR)

(72) Inventor: Sun-Ki Kim, Gunpo-si (KR)

(73) Assignee: JOINSET CO., LTD. (KR)

( * ) Notice: Subject to any disclaimer, the term of this patent is extended or adjusted under 35 U.S.C. 154(b) by 265 days.

(21) Appl. No.: 17/740,614

(22) Filed: May 10, 2022

(65) Prior Publication Data

US 2022/0271464 A1     Aug. 25, 2022

Related U.S. Application Data

(63) Continuation of application No. PCT/KR2020/015853, filed on Nov. 12, 2020.

(30) Foreign Application Priority Data

Nov. 15, 2019 (KR) .................... 10-2019-0146590

(51) Int. Cl.
*H01R 13/24* (2006.01)
*H01R 4/58* (2006.01)

(52) U.S. Cl.
CPC ........... *H01R 13/2414* (2013.01); *H01R 4/58* (2013.01)

(58) Field of Classification Search
CPC ................................................ H01R 13/2414
See application file for complete search history.

(56) References Cited

U.S. PATENT DOCUMENTS

| | | | |
|---|---|---|---|
| 2009/0209121 A1* | 8/2009 | Kim ..................... | H05K 3/4015 439/83 |
| 2009/0227127 A1* | 9/2009 | Kim ..................... | H05K 3/4015 439/78 |
| 2011/0266031 A1* | 11/2011 | Kim .................... | H01R 13/2414 174/126.2 |
| 2012/0118608 A1* | 5/2012 | Kim ..................... | H05K 3/3421 174/126.2 |
| 2016/0336093 A1* | 11/2016 | Kim ................... | H01R 13/2414 |

(Continued)

FOREIGN PATENT DOCUMENTS

| | | |
|---|---|---|
| JP | 2015089102 A | 5/2015 |
| KR | 200217600 B | 1/2001 |
| KR | 1020070063481 A | 6/2007 |

(Continued)

OTHER PUBLICATIONS

Korean Office Action (KR 10-2019-0146590), KIPO, Feb. 23, 2021.
(Continued)

*Primary Examiner* — Hung V Ngo
(74) *Attorney, Agent, or Firm* — Park & Associates IP Law Office

(57) ABSTRACT

An elastic electrical contact terminal capable of implementing a reliable electrical connection between objects, wherein the electrical contact terminal includes: an elastic core; a silicone rubber adhesive applied to the outer surface of the elastic core; and an electrically conductive fiber wrapped around and bonded to the elastic core by means of being interposed with the silicone rubber adhesive, wherein a sheet has a polymer coating layer formed on the inner surface thereof facing the silicone rubber adhesive, and has a metal layer formed on the outer surface thereof.

9 Claims, 4 Drawing Sheets

(56) References Cited

U.S. PATENT DOCUMENTS

2017/0229795 A1* 8/2017 Kim .................. H01R 4/625

FOREIGN PATENT DOCUMENTS

| KR | 1020090093577 A | 9/2009 |
| KR | 1020100125617 A | 12/2010 |
| KR | 1020120028797 A | 3/2012 |
| KR | 1020170048109 A | 5/2017 |
| KR | 1020170135627 A | 12/2017 |

OTHER PUBLICATIONS

Korean Office Action (KR 10-2019-0146590), KIPO, Aug. 27, 2021.
Korean Office Action (KR 10-2019-0146590), KIPO, Feb. 25, 2022.
International Search Report (PCT/KR2020/015853), WIPO, Apr. 5, 2021.

* cited by examiner

ELASTIC ELECTRICAL CONTACT TERMINAL

REFERENCE TO RELATED APPLICATIONS

This is a continuation of International Patent Application PCT/KR2020/015853 filed on Nov. 12, 2020, which designates the United States and claims priority of Korean Patent Application No. 10-2019-0146590 filed on Nov. 15, 2019, the entire contents of which are incorporated herein by reference.

FIELD OF THE INVENTION

The present invention relates to an elastic electrical contact terminal, and more particularly, to an elastic electrical contact terminal capable of implementing a reliable electrical connection between objects with elasticity and having less electrical contact resistance to facing objects.

BACKGROUND OF THE INVENTION

In general, an elastic electrical contact terminal should have excellent electrical conductivity and elasticity and is fixed to a printed circuit board through soldering or using a double-sided electroconductive pressure-sensitive adhesive tape.

FIG. 1 illustrates an example of a conventional electrical contact terminal.

An insulating urethane sponge 10 is surrounded by an electroconductive sheet 30 coated with a hot-melted adhesive 20 which is a urethane or acrylic thermoplastic polymer adhesive and these are bonded using heat, and then a double-sided electroconductive pressure-sensitive adhesive tape 40 is attached to a bottom surface of electroconductive filaments.

Here, as disclosed in Utility Model Registration No. 217600 filed by the inventor, an electroconductive sheet is generally formed by electroless plating woven or non-woven fibers such as polyester (PET) or nylon with copper and then a metal layer is formed thereon by plating with nickel or gold in order to prevent corrosion or the like.

According to the conventional electrical contact terminal, when the electroconductive sheet is thin, particularly, like a circle shown in FIG. 1, the sheet 30 is formed by weaving filaments 32, the liquefied hot-melt adhesive 20 melted by heat may move outward and protrude above the filaments 32 through gaps 33 formed while the filaments 32 are woven and may be cured.

Since the hot-melt adhesive is electrically insulated generally, when the hot-melt adhesive high protrudes outward from an outer surface of the electroconductive sheet, while a protruding part comes into contact with an electroconductive object, electrical resistance between the object and the electroconductive sheet increases, and thus, electrical connection between objects through the electrical contact terminal is not reliably performed.

When the hot-melt adhesive is electrically conductive, the hot-melt adhesive is expensive and has a disadvantage that electrical resistance is very higher than the electroconductive sheet.

In addition, since the hot-melt adhesive generally includes thermosetting polymers such as polyurethane and is melted again when heat is applied thereto, it is difficult to maintain adhesion at high temperatures, for example, at 105° C. or higher and thus it is difficult to use the hot-melt adhesive at such temperatures.

Also, there is a disadvantage that it is difficult to economically provide electroconductive contact terminals having a variety of shapes by using only a urethane sponge as an elastic body.

SUMMARY OF THE INVENTION

The present invention is directed to providing an elastic electrical contact terminal which facilitates use at high temperatures and providing elasticity and flexibility in a variety of directions.

The present invention is also directed to providing an elastic electrical contact terminal having improved elastic restorability at high temperatures.

The present invention is also directed to providing an elastic electrical contact terminal in which an electroconductive sheet directly comes into electrical contact with an electroconductive object due to elasticity so that electrical contact resistance is minimized.

The present invention is also directed to providing an elastic electrical contact terminal which facilitates minimizing of an amount of adhesive and minimizing of a compressive force with facing objects.

The present invention is also directed to providing an elastic electrical contact terminal which has high elastic restorability with less pressing force and is advantageous to a great height.

The present invention is also directed to providing an elastic electrical contact terminal which facilitates economically providing a variety of shapes.

One aspect of the present invention provides an elastic electrical contact terminal which is interposed between facing objects to electrically connect the facing objects. The elastic electrical contact terminal includes an elastic core, a silicone rubber adhesive applied to an outer surface of the core, and an electroconductive sheet surrounding and adhering to the core with the adhesive interposed therebetween. Here, the sheet is formed by plating woven filaments with metal, and a polymer coating layer is formed on an inner surface of the sheet which faces the adhesive and adheres to the adhesive. Also, an outer surface of the sheet directly comes into electrical contact with the facing objects.

The core may be a foam which has a quadrangular cross section and in which skin layers are formed on a pair of surfaces corresponding to each other, and both longitudinal cross sections which are exposed outward have an open cell structure.

The core may further include a non-foamed elastic body stacked below the foam with an adhesive interposed therebetween. The foam may have a height greater than a height of the elastic body. The foam may have hardness and a compressive force which are smaller than hardness and a compressive force of the elastic body, respectively.

The core may be a silicone rubber tube.

The adhesive may be formed by thinly applying and curing a liquefied silicone rubber corresponding to the adhesive.

The polymer coating layer may be formed by thinly applying and curing a liquefied polymer coating liquid corresponding to the polymer coating layer. Also, the polymer coating layer may not come into direct contact with the objects due to the polymer coating liquid which moves outward through gaps between woven filaments.

The electrical contact terminal may include a double-sided electroconductive pressure-sensitive adhesive tape which coves and adheres to the outer surface of the sheet which is attached to a lower surface of the core to be spaced apart therefrom.

According to the present invention, a silicone rubber adhesive which is not melted again at high temperatures is applied to a woven electroconductive sheet having elasticity and flexibility in a variety of directions so that the elastic electrical contact terminal is usable at high temperatures and has elasticity and flexibility in a variety of directions.

Also, due to the silicone rubber adhesive having high elastic restorability at room temperature and high temperatures, elastic restorability is improved at room temperature and maintained at high temperatures.

Also, since a liquefied silicone rubber adhesive does not move and protrude outward from an outer surface of the electroconductive sheet due to a polymer coating layer, electroconductive filaments and an electroconductive object directly come into electrical contact with each other so as to minimize electrical contact resistance.

Also, since a foam having an open cell structure including a skin layer on a surface which comes into contact with an adhesive or a composite in which a foam and a non-foamed elastic body are stacked is used as an elastic core, it is easy to minimize an amount of adhesive and a compressive force.

Also, a silicone rubber tube having a smooth surface and including longitudinal through holes is used as the elastic core so as to facilitate minimizing of an amount of adhesive, use at high temperatures, and economically providing of a variety of shapes.

DETAILED DESCRIPTION OF THE INVENTION

Hereinafter, exemplary embodiments of the present invention will be described in detail with reference to the attached drawings.

Figure 1:
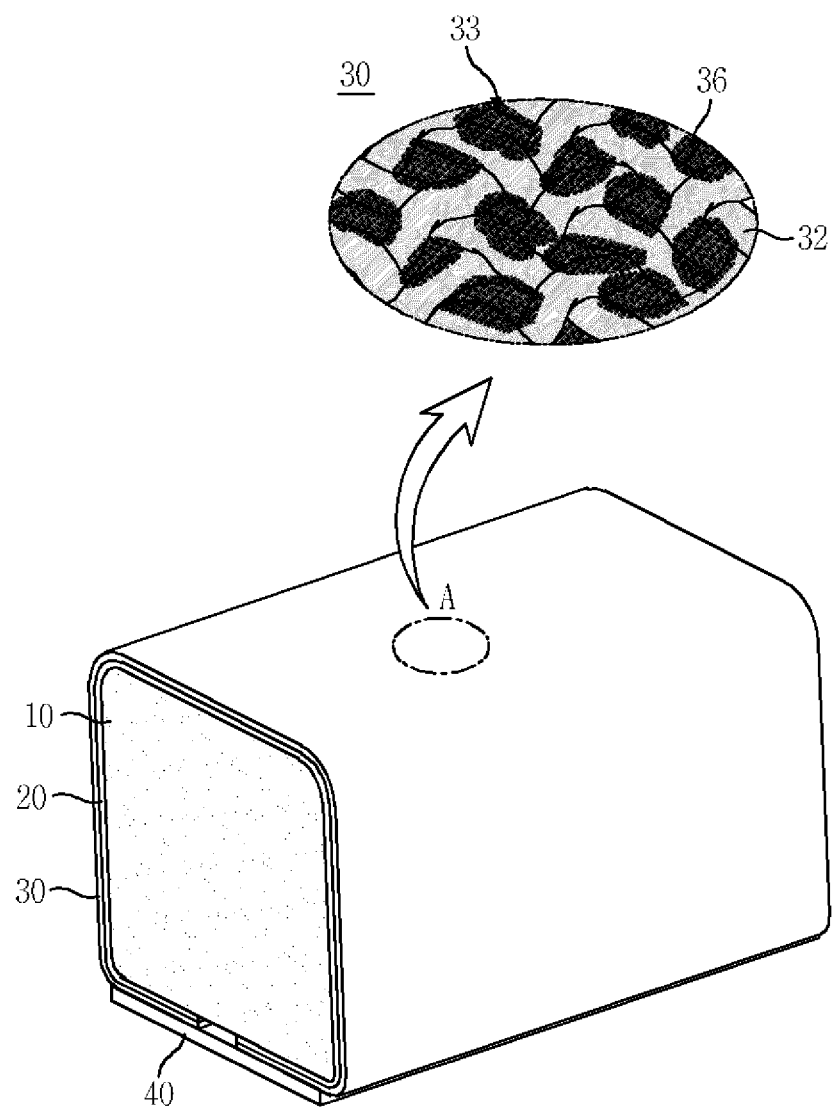
FIG. 1 illustrates an example of a conventional electrical contact terminal.
Figure 2:
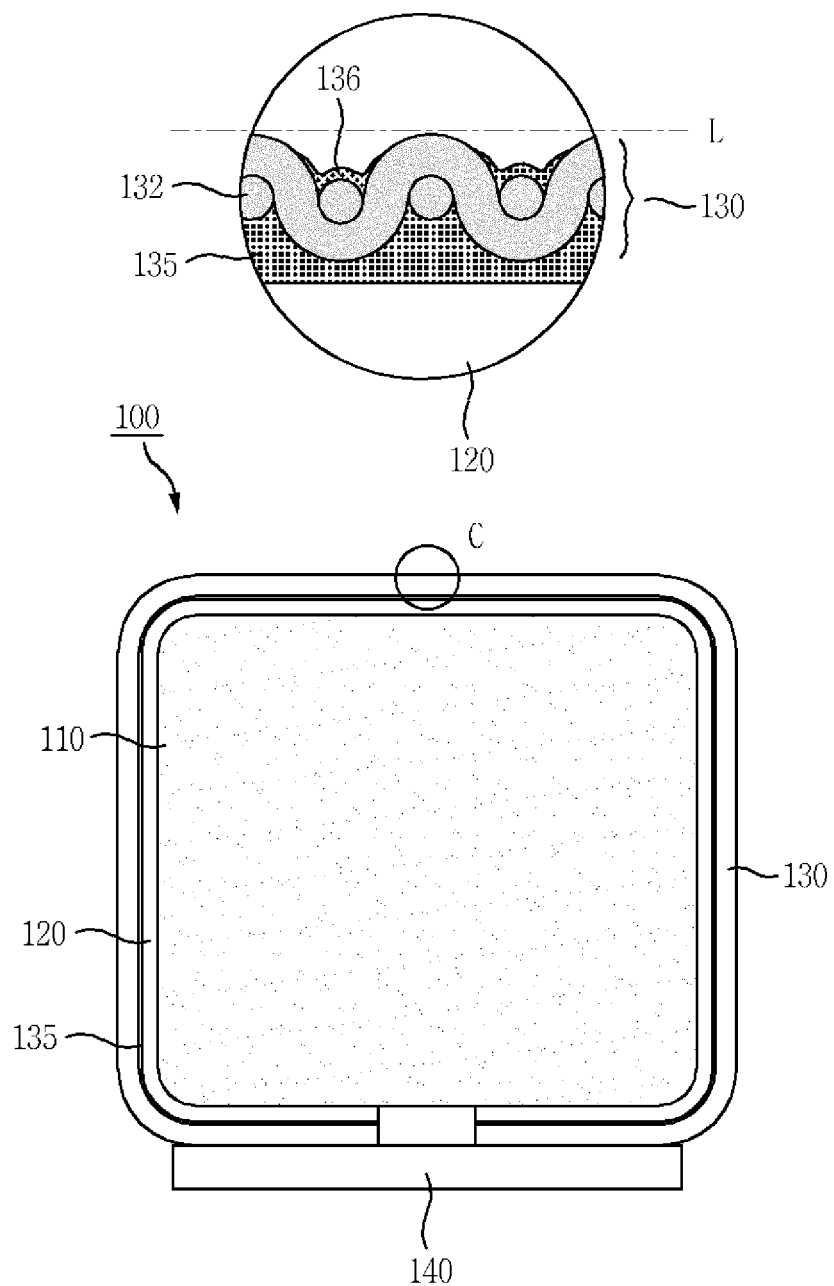
FIG. 2 is a front view illustrating an example of an electrical contact terminal according to the present invention.
Figure 3:
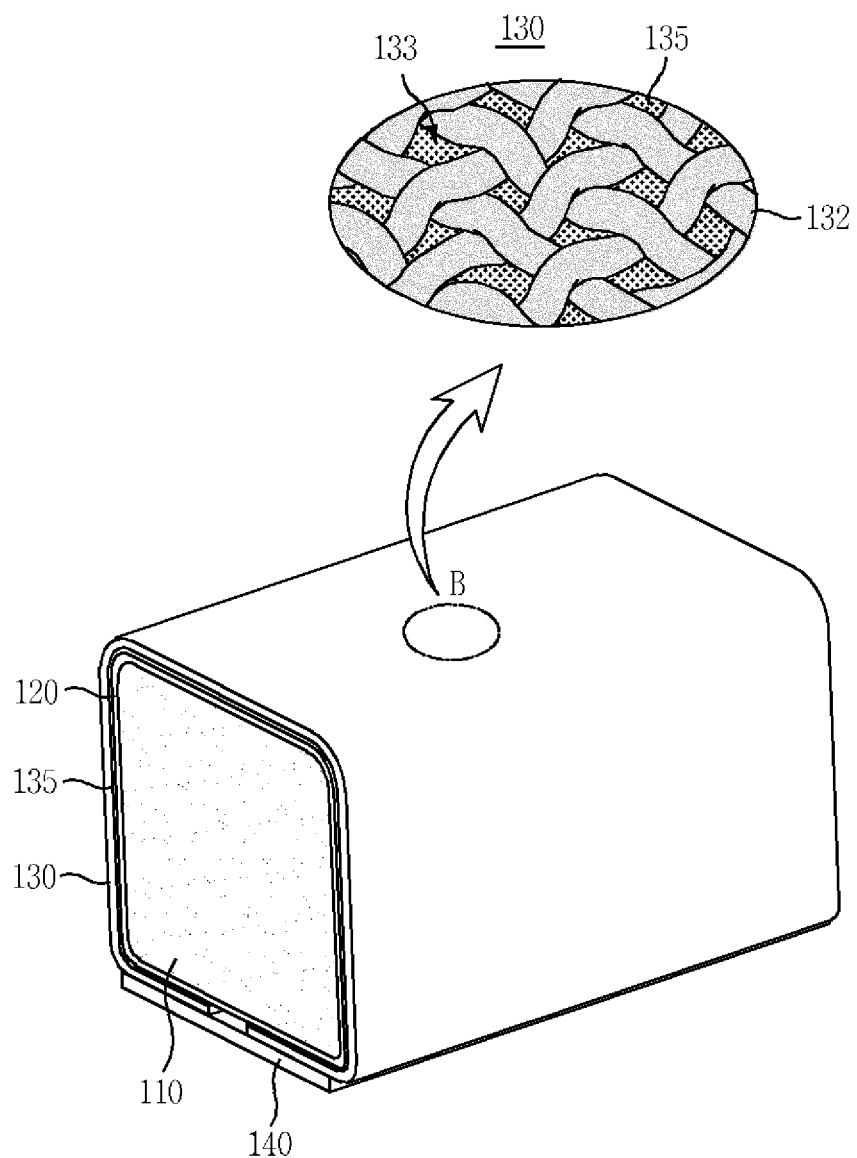
FIG. 3 is a perspective view illustrating an example of the electrical contact terminal according to the present invention.

FIG. 2 is a front view illustrating an example of an electrical contact terminal according to the present invention, and FIG. 3 is a perspective view illustrating an example of the electrical contact terminal according to the present invention.

An electrical contact terminal 100 includes an elastic foam core 110, a silicone rubber adhesive 120 applied to an outer surface of the elastic core 110, and an electroconductive sheet 130 which surrounds the elastic core 110 with the silicone rubber adhesive 120 interposed therebetween and includes a polymer coating layer 135.

A double-sided electroconductive pressure-sensitive adhesive tape 140 which covers and adheres to a lower surface of the sheet 130 having both spaced ends may be included as necessary.

The electrical contact terminal 100 to which the adhesive tape 140 adheres may be easy to be used while adhering to an object, and the electrical contact terminal 100 with no the adhesive tape 140 attached thereto may be used while being inserted into a groove or the like of an object.

A foam (sponge) formed of a urethane rubber or silicone rubber adequate for high temperature may be used as the elastic foam core 110, and the silicone rubber adhesive 120 is a thermosetting silicone rubber which is not melted again by heat and maintains adhesion to improve elasticity and elastic restorability of the electrical contact terminal 100 at room temperature and high temperatures.

When the elastic core 110 is a foam, skin layers may be formed on a pair of corresponding surfaces of the foam. In this case, the adhesive 120 which is applied to the skin layers is not absorbed into the foam, and thus may reduce an amount of adhesive.

The foam is formed to have a quadrangular cross section and may maintain a quadrangular shape or may be modified to have a rectangular shape in which both corners of an upper surface are rounded while the core 110 is formed.

Since both longitudinal cross sections of the elastic core 110 which are exposed outward include an open cell structure such that air may easily move outward through pores of the elastic core 110, the elastic core may be much pressed with less force and may have high elastic restorability due to air which flows thereinto when the force is removed.

Although not shown in the drawings, the elastic core 110 of the present invention may be a heat-resistant silicone rubber tube including longitudinal through holes. In this case, since the tube has a smooth surface, it is possible to minimize an amount of adhesive, to use the tube at high temperature, and to economically provide a variety of shapes.

The electroconductive sheet 130 may be manufactured by electroless plating woven nylon or polyester filaments with nickel, copper, silver, or gold so that a metal layer is formed as an outermost layer.

Also, since electroconductive filaments are woven, holes are formed in a thickness direction. Here, the smaller holes the better.

The woven filaments may have a thickness of 0.015 mm to 0.01 mm.

When the woven filaments have a black outer surface due to the metal layer which is the outermost layer, the woven filaments may be plated with black nickel or may be coated with an electroconductive paint including electroconductive carbon.

A polymer coating layer 135 is formed on an inner surface of the electroconductive sheet 130 to have a very small thickness to block pores formed in a thickness direction of the electroconductive sheet 130 which is woven and then plated.

Although the polymer coating layer 135 is formed on the woven filaments plated with the metal layer and has a thickness which is not uniform due to an uneven surface of the filaments.

The polymer coating layer 135 may be formed on one side of the plated filaments through single-sided casting or a transfer method and may include a material which is a polymer resin adhesive having high heat resistance.

When a liquid silicone rubber adhesive corresponding to the silicone rubber adhesive 120 is disposed on the polymer coating layer 135 of the electroconductive sheet 130 and surrounds the elastic core 110 and then heat and pressure are applied thereto, the silicone rubber adhesive 120 is cured and interposed between the elastic core 110 and the polymer coating layer 135 to adhere thereto.

The polymer coating layer 135 having a small thickness is formed on an inner surface of the electroconductive sheet 130 which faces the silicone rubber adhesive 120.

In an enlarged circle of FIG. 2, the sheet 130 is formed by weaving filaments 132 as the weft and warp and the polymer coating layer 135 is formed on the inner surface of the sheet 130.

In detail, the polymer coating liquid is applied thinly to the inner surface of the electroconductive sheet 130 and cured so as to form the polymer coating layer 135. Here, the polymer coating liquid completely covers the inner surface of the sheet 130 and partially moves to an outer surface opposite the inner surface through gaps 133 between the woven filaments 132 to form a leakage layer 136.

Here, the leakage layer 136 is formed not to further protrude than an upper limit L of the sheet 130 by controlling an amount of the applied polymer coating liquid.

The amount of the applied polymer coating liquid is controlled by adjusting the viscosity of the polymer coating liquid and a coating speed thereof.

According to this structure, when the liquefied silicone rubber adhesive 120 is applied to the polymer coating layer 135 and cured, the liquefied silicone rubber adhesive 120 does not leak outward from the polymer coating layer 135 so that the silicone rubber adhesive 120 and the polymer coating layer 135 of the electroconductive sheet 130 do not come into electrical contact with an electroconductive object located on the outer surface of the electroconductive sheet 130.

As a result, there is an advantage that electrical resistance between the electrical contact terminal and the electroconductive object is smaller than that of a case in which the surface of electroconductive filaments directly comes into electrical contact with an electroconductive object and a silicone rubber adhesive protruding from the surface of the filaments exists.

Figure 4:
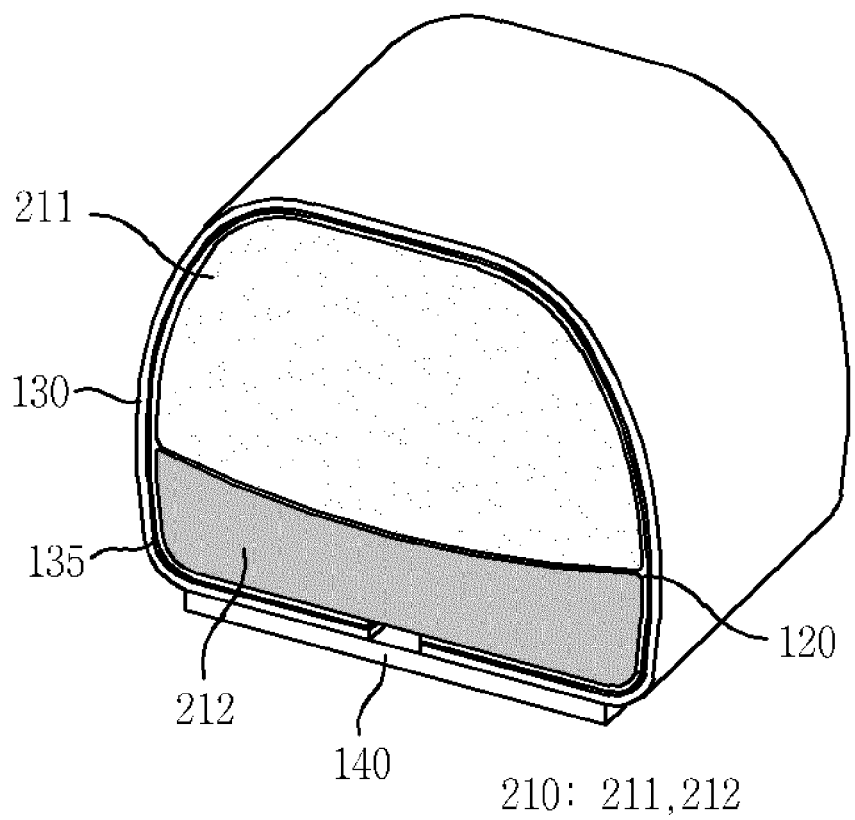
FIG. 4 is a front view illustrating another example of the electrical contact terminal according to the present invention.

FIG. 4 is a front view illustrating another example of the electrical contact terminal according to the present invention.

In the embodiment, an elastic core 210 includes a foam 211 and a non-foamed elastic body 212 stacked below the foam 211 with an adhesive interposed therebetween.

In this case, in consideration of a working distance, a compressive force, elastic restorability, and the like of the electrical contact terminal, the foam 211 may have a height greater than a height of the elastic body 212 and have hardness and compressive force of the foam 211 smaller than hardness and compressive force of the elastic body 212.

Here, the foam may include the same material, structure, and properties as those of the above embodiment and the elastic body may be a heat-resistant silicone rubber and formed with or without holes.

According to this structure, the non-foamed elastic body 212 located below may be generally used for maintaining an overall shape and the foam 211 located above may be generally used for a pressing force, a working distance, and elastic restoration.

Although the embodiments of the present invention have been described above, it is apparent that a variety of modifications may be made by those skilled in the art. Therefore, the scope of the present invention should not be limited to the above embodiments and should be construed by the following claims.

What is claimed is:

1. An elastic electrical contact terminal which is interposed between facing objects to electrically connect the facing objects, comprising:
   an elastic core;
   a silicone rubber adhesive applied to an outer surface of the core; and
   an electroconductive sheet surrounding and adhering to the core with the adhesive interposed therebetween,
   wherein the sheet is formed by plating woven filaments with metal,
   wherein a polymer coating layer is formed on an inner surface of the sheet which faces the adhesive and adheres to the adhesive, so that the adhesive does not protrude to the outer surface of the sheet by the polymer coating layer, and
   wherein an outer surface of the sheet directly comes into electrical contact with the facing objects.

2. The elastic electrical contact terminal of claim 1, wherein the core is a foam in which skin layers are formed on a pair of surfaces corresponding to each other on a cross section, and both longitudinal cross sections exposed outward have an open cell structure.

3. The elastic electrical contact terminal of claim 2, wherein the core further comprises a non-foamed elastic body stacked below the foam with an adhesive interposed therebetween.

4. The elastic electrical contact terminal of claim 3, wherein the foam has a height greater than a height of the elastic body.

5. The elastic electrical contact terminal of claim 3, wherein the foam has hardness and a compressive force which are smaller than hardness and a compressive force of the elastic body, respectively.

6. The elastic electrical contact terminal of claim 1, wherein the core is a silicone rubber tube.

7. The elastic electrical contact terminal of claim 1, wherein the adhesive is formed by applying and curing a liquefied silicone rubber corresponding to the adhesive.

8. The elastic electrical contact terminal of claim 1, wherein the polymer coating layer is formed by applying and curing a liquefied polymer coating liquid corresponding to the polymer coating layer, and
   wherein the polymer coating layer does not come into direct contact with the objects due to the polymer coating liquid which moves outward through gaps between woven filaments.

9. The elastic electrical contact terminal of claim 1, comprising a double-sided electroconductive pressure-sensitive adhesive tape which covers and adheres to the outer surface of the sheet which is attached to a lower surface of the core to be spaced apart therefrom.

* * * * *